(12) United States Patent
Tzeng et al.

(10) Patent No.: US 8,207,620 B2
(45) Date of Patent: Jun. 26, 2012

(54) FLIP-CHIP SEMICONDUCTOR PACKAGE AND CHIP CARRIER FOR PREVENTING CORNER DELAMINATION

(75) Inventors: Yuan-Lin Tzeng, Taichung Hsien (TW); Nai-Hao Kao, Taichung Hsien (TW); Jeng-Yuan Lai, Taichung Hsien (TW); Yu-Po Wang, Taichung Hsien (TW); Cheng-Hsu Hsiao, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 39 days.

(21) Appl. No.: 11/880,467

(22) Filed: Jul. 20, 2007

(65) Prior Publication Data

US 2008/0017983 A1 Jan. 24, 2008

(30) Foreign Application Priority Data

Jul. 20, 2006 (TW) ................. 95126475 A

(51) Int. Cl.
*H01L 23/29* (2006.01)

(52) U.S. Cl. ........ 257/795; 257/778; 257/783; 257/789; 257/790; 438/108; 438/118; 438/127

(58) Field of Classification Search .................. 257/678, 257/787, 789, 790, 795, 737, 738, 778, 779, 257/780, 781, 782, 783, 791, 788, 777, 784, 257/799; 438/612, 613, 108, 109, 124, 126, 438/127, 118
See application file for complete search history.

(56) References Cited

U.S. PATENT DOCUMENTS

| | | | | |
|---|---|---|---|---|
| 5,629,566 A | * | 5/1997 | Doi et al. ................. | 257/789 |
| 2002/0079593 A1 | * | 6/2002 | Huang ..................... | 257/778 |
| 2005/0224252 A1 | * | 10/2005 | Mishiro ................... | 174/256 |
| 2005/0287702 A1 | * | 12/2005 | Victor Tan et al. ....... | 438/106 |
| 2006/0219432 A1 | * | 10/2006 | Usui et al. ............... | 174/262 |
| 2006/0220259 A1 | * | 10/2006 | Chen et al. .............. | 257/778 |

* cited by examiner

*Primary Examiner* — Ha Tran T Nguyen
*Assistant Examiner* — Thanh Y Tran
(74) *Attorney, Agent, or Firm* — Peter F. Corless; Steven M. Jensen; Edwards Wildman Palmer LLP

(57) ABSTRACT

The present invention discloses a flip-chip semiconductor package and a chip carrier thereof. The chip carrier includes a groove formed around a chip-mounting area. The groove may be formed along a periphery of the chip-mounting area or at corners thereof. The groove is filled with a filler of low Young's modulus so as to absorb and eliminate thermal stress, thereby preventing delamination between an underfill and a flip chip mounted on the chip-mounting area.

10 Claims, 4 Drawing Sheets

FLIP-CHIP SEMICONDUCTOR PACKAGE AND CHIP CARRIER FOR PREVENTING CORNER DELAMINATION

FIELD OF THE INVENTION

The present invention relates to semiconductor packages and chip carriers thereof, and more particularly, to a flip-chip semiconductor package and a chip carrier thereof.

BACKGROUND OF THE INVENTION

A flip-chip semiconductor package is a type of semiconductor package with its electrical connection being established by means of flip-chip technology. For example, in a flip-chip semiconductor package, an active surface of at least one semiconductor chip is attached to and electrically connected to a substrate via a plurality of solder bumps. Recently, such design has become a dominating packaging technique, because such design not only can reduce package size and decrease the ratio of the semiconductor chip to the substrate, it can also reduce impedance and enhance electrical functions as it does not require the use of bonding wires.

Referring to FIGS. 1A and 1B, a prior-art flip-chip semiconductor package is disclosed. First, a flip chip 10 is mounted on and electrically connected to a substrate 11 via a plurality of solder bumps 13, and then an underfill 12 is filled between the flip chip 10 and the substrate 11 so as to encapsulate and protect the solder bumps 13, and support the weight of the flip-chip 10. Similar techniques may be found in U.S. Pat. Nos. 6,225,704, 6,074,895, 6,372,544 and 5,218,234.

Nevertheless, owing to the surface tension of the underfill 12, after filling the underfill 12, only a minimum amount of coherence protection is provided for the corners of the flip chip 10. Moreover, due to a mismatch of coefficient of thermal expansion (CTE) between the flip chip 10 and the substrate 11, thermal stress and thermal deformation raised during the heat cycle of the semiconductor chip packaging is directly proportional to the corner-to-center distance, which can be expressed as $\delta$(deformation)=$\alpha$(coefficient of thermal expansion)*L(distance, when deformation =0)*$\Delta$t(change of temperature). In other words, as corners of the flip-chip 10 are the farthest from the center of the chip, the corners are subjected to the thermal stress and thermal deformation to the greatest extent. Furthermore, if the underfill 12 fails to provide sufficient protection, peripheral portions of the underfill 12 may be delaminated from the chip 10 (as indicated by S in FIG. 1B), thus undermining the underfill 12. Moreover, if such peripheral delamination is turned into a more severe situation, the delamination may be expanded from the peripheral to the center of the underfill 12, thereby affecting the electrical functions of the solder bumps 13 badly.

Moreover, as the mainstream products of semiconductor chips are manufactured by ever-advancing process technology from 90 nm node to 65 nm node, 45 nm node, or even 32 nm node, it is necessary to introduce a dielectric material with a low dielectric constant K in order to overcome resistor-capacitor (RC) time delay due to ever-dwindling line widths of semiconductor chips. This thereby allows metal traces within a chip to be arranged in position close to each other, so as to prevent signal leakage and interference as well as increasing transmission speed. However, the low-K dielectric material typically has a hard and brittle characteristic and therefore is susceptible to delamination, because the low-K dielectric material cannot efficiently absorb and eliminate thermal stress generated during fabrication processes.

Referring to FIG. 2, U.S. Pat. No. 6,734,567 suggests a flip-chip semiconductor package comprising a flip chip 20 and a substrate 21, wherein the substrate 21 has a metal ring 24 formed thereon so as to prevent underfill delamination extending from the periphery to the center of the substrate 21. Nevertheless, U.S. Pat. No. 6,734,567 does not disclose or teach a way to prevent delamination between the underfill and the flip chip 20 and delamination inside the flip chip 20.

In view of the foregoing drawbacks, industrial manufacturers use underfills of low Young's modulus to absorb thermal stress in order to solve the thermal stress problem arising from different coefficients of thermal expansion (CTE). However, simply applying an underfill with low Young's modulus cannot provide a strong and sufficient supporting strength for the solder bumps. On the other hand, an underfill with high Young's modulus may provide a greater supporting strength for the solder bumps, but the underfill with high Young's modulus makes the flip chip subject to thermal stress and therefore results in delamination. Accordingly, a lot of researches and studies have to be done in order to find underfills suitable for connecting chips and substrates of different sizes and kinds, however these researches and studies are often laborious, cost-consuming, time-consuming and test-based, thereby leading to a prolonged fabrication process and higher fabrication costs.

Hence, a need still remains for providing a solution that can effectively prevent delamination between the underfill and the chip, delamination between the underfill and the substrate, and delamination within the chip, as well as protecting the solder bumps.

Solutions to these problems have been long sought but prior developments have not taught or suggested any solutions and, thus, solutions to these problems have long eluded those skilled in the art.

SUMMARY OF THE INVENTION

In light of the foregoing drawbacks of the prior art, a primary objective of the present invention is to provide a flip-chip semiconductor package and a chip carrier thereof, which can prevent underfill-chip delamination, underfill-substrate delamination, and delamination within a semiconductor chip.

Another objective of the present invention is to provide a flip-chip semiconductor package and a chip carrier thereof, which can provide a superior support for a semiconductor chip as well as protect solder bumps.

Yet another objective of the present invention is to provide a flip-chip semiconductor package and a chip carrier thereof, which can reduce a tremendous amount of time and money spent on researching an underfill capable of avoiding delamination due to a mismatch of coefficient of thermal expansion between a semiconductor chip and a substrate.

In order to achieve the above objectives, the present invention discloses a flip-chip semiconductor package, comprising: a chip carrier having at least one chip-mounting area and a groove formed in position around the chip-mounting area; a flip chip attached to and electrically connected to the chip-mounting area of the chip carrier via a plurality of solder bumps; a filler of low Young's modulus for filling the groove; and an underfill interposing between the flip-chip and the chip carrier.

The present invention also discloses a chip carrier employed in a flip-chip semiconductor package. The chip carrier comprises a body, a chip-mounting area formed on the body for attaching to a flip chip, and a groove formed around the chip-mounting area for filling with a filler of low Young's modulus.

For instance, the chip carrier may be a substrate and the groove may be formed in a solder mask on the substrate. Moreover, the groove may be formed in position along the periphery of the chip-mounting area or at the four corners thereof. Accordingly, when a filler of low Young's modulus is filled into the groove, the filler is disposed in position corresponding to at least a corner or a side of the flip chip mounted on the chip-mounting area, so as to absorb and eliminate thermal stress, preventing occurrence of corner delamination of the flip chip. In addition, the filler may be made of any material having a glass transition temperature Tg of less than 80° C., or a Young's modulus of less than 2000 Mpa at room temperature (25° C.).

Accordingly, the present invention discloses a flip-chip semiconductor package and a chip carrier thereof. One of the main features of the present invention is that the chip carrier comprises a groove formed in position corresponding to a chip-mounting area, wherein the groove may be formed in position corresponding to the periphery of the chip-mounting area or the corners thereof. Moreover, a filler of low Young's modulus is employed to fill the groove so as to protect corners of a flip chip mounted on the chip-mounting area above the filler as well as absorbing and eliminating thermal stress. In addition, an underfill is employed to interpose between the flip chip and the chip carrier and among a plurality of solder bumps so as to protect the solder bumps and provide support for the flip chip, thereby preventing delamination between the underfill and the flip chip, delamination between the underfill and the chip carrier, and delamination within the flip chip. As a result, the present invention can save a tremendous amount of time and money in researching and producing a suitable underfill for each of different kinds of semiconductor packages and solving delamination problems.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1A:
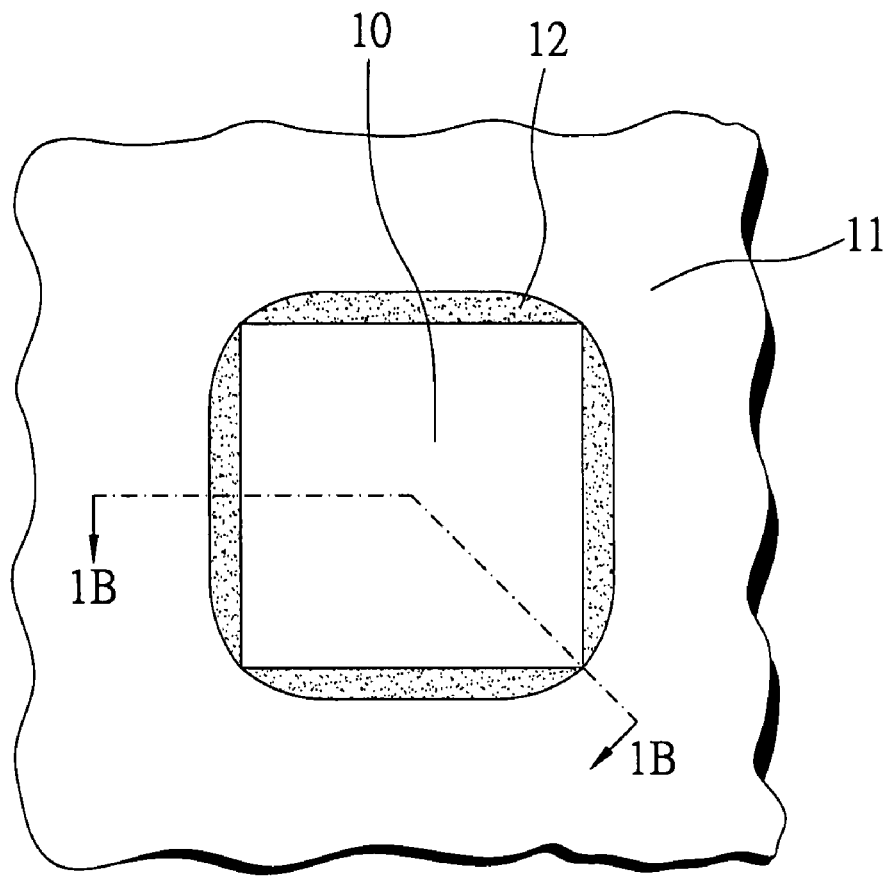
FIG. 1A (PRIOR ART) is a plan view showing a prior-art flip-chip semiconductor package.
Figure 1B:
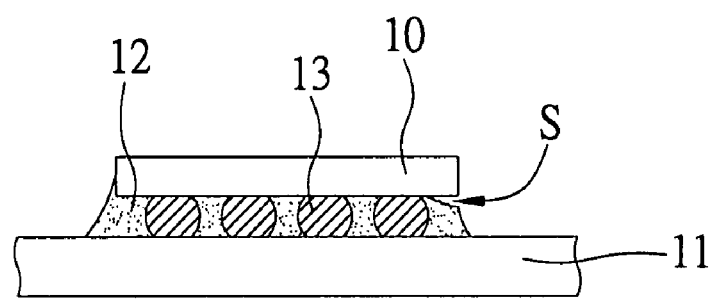
FIG. 1B (PRIOR ART) is a cross-sectional view taken along the section line 1B-1B of FIG. 1A.
Figure 2:
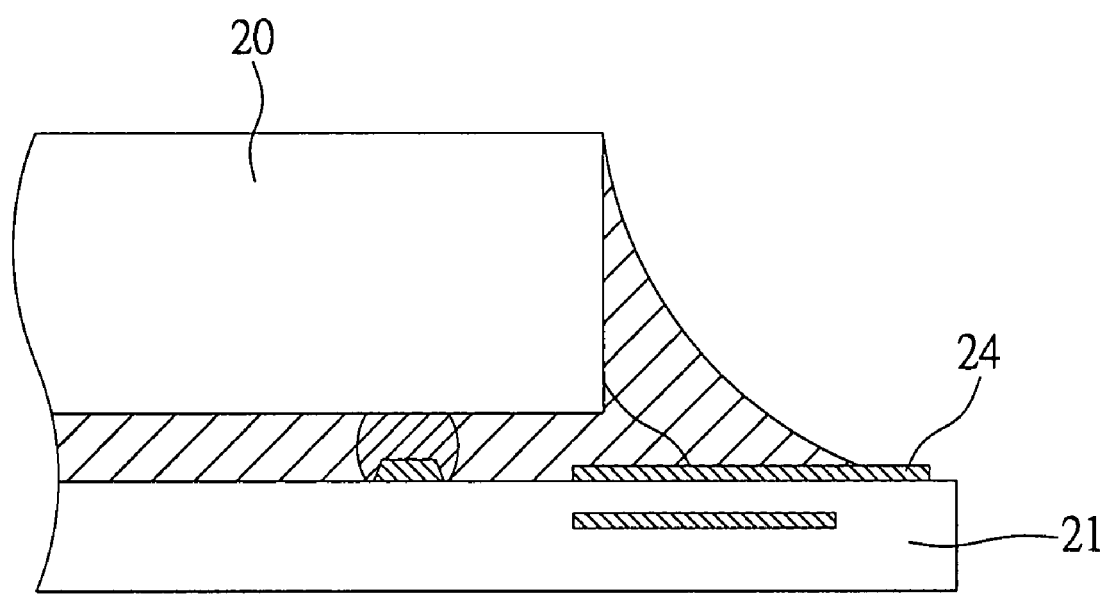
FIG. 2 (PRIOR ART) is a cross-sectional view showing a flip-chip semiconductor package disclosed in U.S. Pat. No. 6,734,567.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

Likewise, the drawings showing embodiments of the structure are semi-diagrammatic and not to scale and, particularly, some of the dimensions are for the clarity of presentation and are shown greatly exaggerated in the drawing. Similarly, although the views in the drawings for ease of description generally show similar orientations, this depiction in the drawings is arbitrary for the most part. Generally, the invention can be operated in any orientation.

For expository purposes, the term "horizontal" as used herein is defined as a plane parallel to the plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Figure 3A:
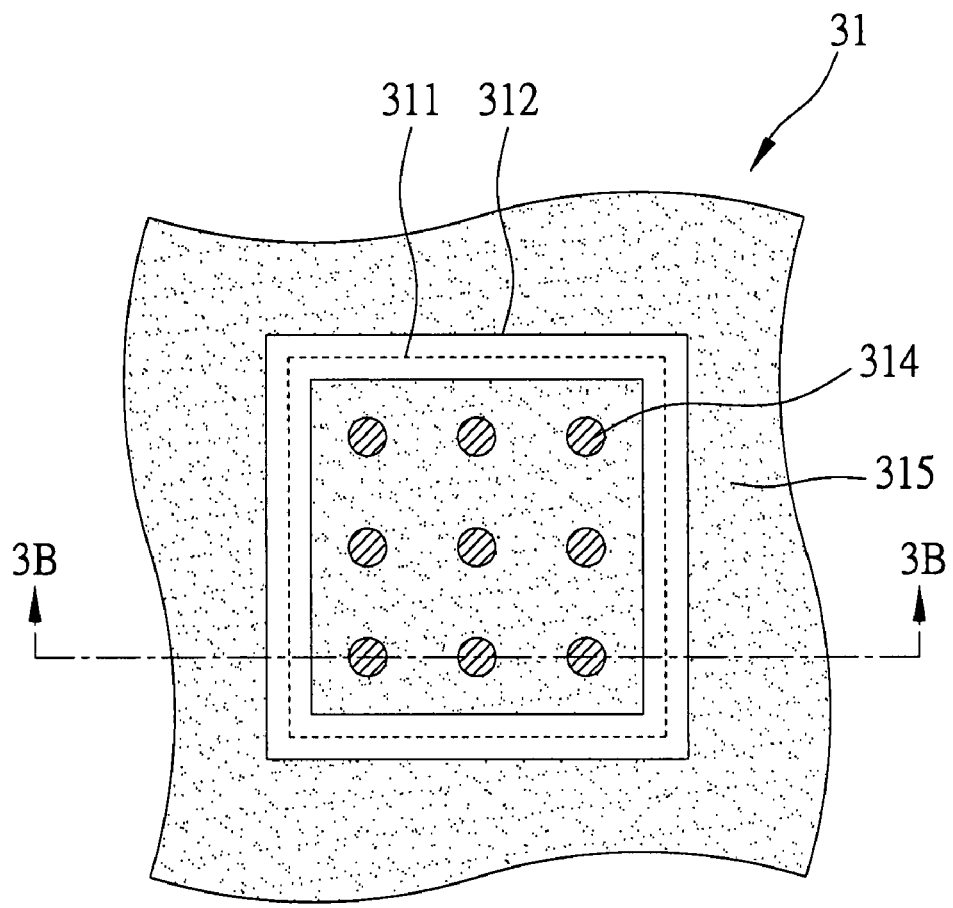
FIGS. 3A and 3B are respectively a top plan view and a cross-sectional view showing a chip carrier of a flip-chip semiconductor package according to a first preferred embodiment of the present invention.
Figure 3B:
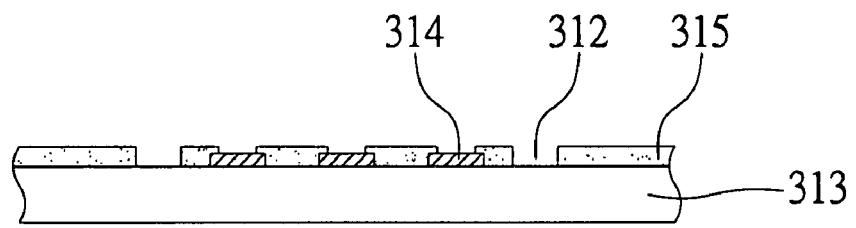

FIGS. 3A and 3B are schematic views showing a chip carrier of a flip-chip semiconductor package according to a first preferred embodiment of the present invention, wherein FIG. 3B is a cross-sectional view of FIG. 3A.

As shown in FIGS. 3A and 3B, the chip carrier is provided, wherein the chip carrier is a substrate 31. The substrate 31 comprise a body, a chip-mounting area 311 predefined on the body for mounting with a flip chip 30, and a groove 312 formed at a corresponding position around the chip-mounting area 311. Moreover, the body further comprises a core layer 313, a plurality of solder pads 314 formed on the core layer 313, and a solder mask 315 covering the core layer 313 but exposing the solder pads 314. In one preferred embodiment, the solder pads 314 are disposed within the chip-mounting area 311, such that the flip chip 30 may be electrically connected to the solder pads 314 through a plurality of solder bumps 33. The groove 312 is formed in the solder mask 315 around the chip-mounting area 311.

Figure 4:
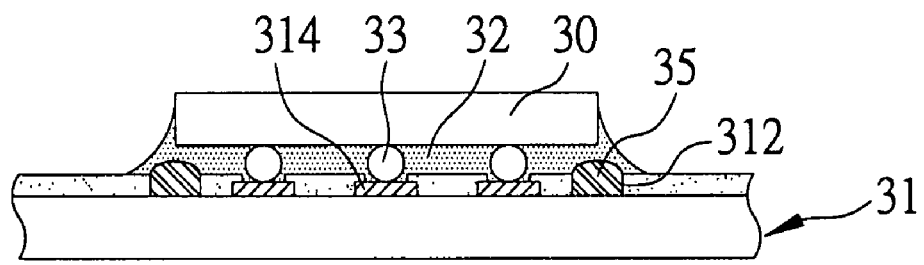
FIG. 4 a cross-sectional view showing a flip-chip semiconductor package according to a first preferred embodiment of the present invention.

FIG. 4 is a cross-sectional view showing a flip-chip semiconductor package of the present invention, wherein a chip carrier of the semiconductor chip is the substrate 31 shown in FIGS. 3A and 3B.

As shown in FIG. 4, the flip-chip semiconductor package comprises a substrate 31 having at least one chip-mounting area 311 and a groove 312 formed in position corresponding to the periphery of the chip-mounting area 311; a flip chip 30 attached to the chip-mounting area 311 and electrically connected to a plurality of solder pads 314 via a plurality of solder bumps 33; a filler 35 with low Young's modulus for filling into the groove 312; and an underfill 32 for interposing between the flip-chip 30 and the substrate 31.

In other words, an active surface of the flip chip 30 is attached to and electrically connected to the solder pads 314 via the solder bumps 33 by means of flip-chip techniques, and the groove 312 is filled with the filler 35 of low Young's modulus, such that the filler 35 is formed and arranged around the periphery of the flip chip 30 so as to absorb and eliminate thermal stress, thereby preventing corner delamination of the flip chip, wherein the filler 35 may be made of any material having a glass transition temperature Tg of less than 80° C. or a Young's modulus of less than 2000 Mpa at room temperature (25° C.), such as silicone. Moreover, the underfill 32 is employed to interpose between the flip-chip 30 and the substrate 31, so as to encapsulate the solder bumps 33 and/or the filler 35, thereby protecting the solder bumps 33 as well as providing support for the flip chip 30, wherein the underfill 32 may be made of any material having a glass transition temperature Tg of greater than 80° C. or a Young's modulus of greater than 2000 Mpa at room temperature (25° C.).

Figure 5:
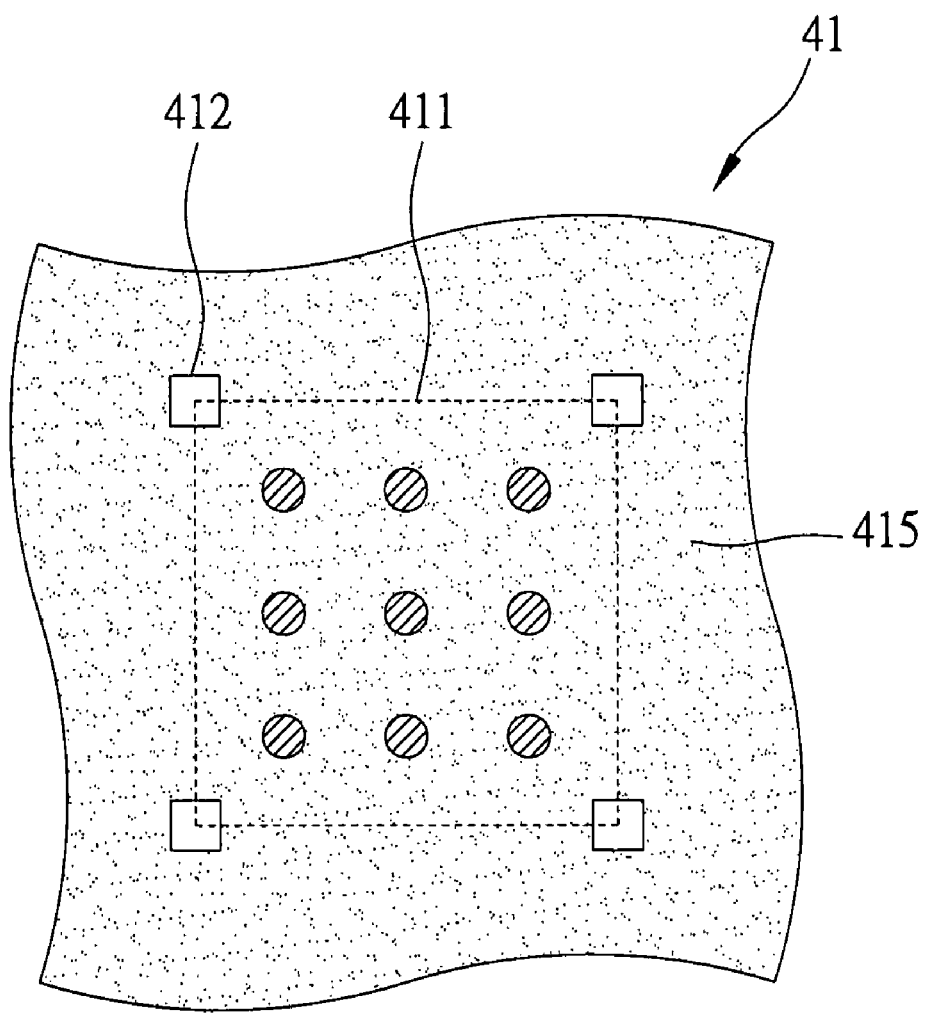
FIG. 5 is a plan view showing a chip carrier of a flip-chip semiconductor package according to a second preferred embodiment of the present invention.

FIG. 5 is a top plan view showing a chip carrier of a flip-chip semiconductor package according to a second preferred embodiment of the present invention.

As shown in FIG. 5, the substrate of this embodiment mainly differs from that of the foregoing embodiment in that a groove 412 is only formed in position corresponding to corners of a chip-mounting area 411 of the substrate 41. In other words, the groove 412 is formed in a solder mask 415 in position corresponding to the corners of the chip-mounting area 411. Therefore, when a semiconductor chip is mounted on the chip-mounting area 411 and the groove 412 is filled with a filler of low Young's modulus, corners of a semiconductor chip mounted on the chip-mounting area are disposed in position above the filler of low Young's modulus, such that thermal stress can be absorbed and eliminated by the filler, thereby preventing corner delamination of the semiconductor chip.

Accordingly, the present invention discloses a flip-chip semiconductor package and a chip carrier thereof. One of the main features of the present invention is that the chip carrier comprises a groove formed in position around the chip-mounting area, wherein the groove may be formed in position corresponding to the periphery of the chip-mounting area or the corners thereof. Moreover, a filler of low Young's modulus is employed to fill the groove so as to protect corners of a flip chip mounted on the chip-mounting area above the filler as well as absorbing and eliminating thermal stress. In addition, an underfill is employed to interpose between the flip chip and the chip carrier and among a plurality of solder bumps so as to protect the solder bumps and provide support for the flip chip, thereby preventing delamination between the underfill and the flip chip, delamination between the underfill and the chip carrier, and delamination within the flip chip. As a result, the present invention can save a tremendous amount of time and money spent on researching and producing an appropriate underfill for each of different semiconductor packages as well as solving delamination.

While the invention has been described in conjunction with exemplary preferred embodiments, it is to be understood that many alternative, modifications, and variations will be apparent to those skilled in the art in light of the foregoing description. Accordingly, it is intended to embrace all such alternatives, modifications, and variations that fall within the scope of the included claims. The scope of the claims, therefore, should be accorded the broadest interpretation so as to encompass all such modifications and similar arrangements. All matters hithertofore set forth herein or shown in the accompanying drawings are to be interpreted in an illustrative and non-limiting sense.

What is claimed is:

1. A flip-chip semiconductor package, comprising:
   a chip carrier having at least one chip-mounting area and a groove formed in position around a periphery of the chip-mounting area;
   a flip chip attached to and electrically connected to the chip-mounting area of the chip carrier via a plurality of solder bumps disposed within the chip-mounting area, wherein at least a corner or a side of the flip chip corresponds in position to the groove;
   a filler of low Young's modulus filling into the groove, wherein the filler corresponds in position to at least the corner or the side of the flip chip to prevent corner delamination of the flip chip; and
   an underfill of high Young's modulus for interposing between the flip-chip and the chip carrier to cover the solder bumps and form on the filler.

2. The flip-chip semiconductor package of claim 1, wherein the chip carrier is a substrate comprising a body, the chip-mounting area disposed on the body, and the groove disposed in position around the chip-mounting area.

3. The flip-chip semiconductor package of claim 2, wherein the body comprises a core layer, a plurality of solder pads formed on the core layer, and a solder mask covering the core layer but exposing the solder pads.

4. The flip-chip semiconductor package of claim 3, wherein the solder pads are disposed within the chip-mounting area, such that the flip chip is electrically connected to the solder pads through the solder bumps.

5. The flip-chip semiconductor package of claim 1, wherein the groove is formed at corners of the chip-mounting area.

6. The flip-chip semiconductor package of claim 1, wherein the filler has a glass transition temperature Tg of less than 80° C.

7. The flip-chip semiconductor package of claim 1, wherein the Young's modulus of the filler is less than 2000 Mpa at room temperature.

8. The flip-chip semiconductor package of claim 1, wherein the underfill has a glass transition temperature Tg of greater than 80° C.

9. The flip-chip semiconductor package of claim 1, wherein the Young's modulus of the underfill is greater than 2000 Mpa at room temperature.

10. The flip-chip semiconductor package of claim 1, wherein the filler of low Young's modulus is made of silicone.

* * * * *